United States Patent
Zinn et al.

(10) Patent No.: US 8,153,187 B2
(45) Date of Patent: Apr. 10, 2012

(54) METHOD FOR OXIDISING A THERMOCOUPLE SHEATH

(75) Inventors: Hanspeter Zinn, Ruetihof (CH);
Giuseppe Bandiera, Ehrendingen (CH);
Thomas Etter, Regensdorf (CH);
Robert Baumann, Klinganau (CH)

(73) Assignee: Alstom Technology Ltd, Baden (CH)

( * ) Notice: Subject to any disclaimer, the term of this patent is extended or adjusted under 35 U.S.C. 154(b) by 345 days.

(21) Appl. No.: 12/472,801

(22) Filed: May 27, 2009

(65) Prior Publication Data
US 2009/0297698 A1 Dec. 3, 2009

(30) Foreign Application Priority Data
May 27, 2008 (EP) ..................... 08104114

(51) Int. Cl.
*B05D 5/06* (2006.01)
(52) U.S. Cl. .................................. 427/126.4
(58) Field of Classification Search ............ 427/126.3
See application file for complete search history.

(56) References Cited

U.S. PATENT DOCUMENTS

| | | | |
|---|---|---|---|
| 2,330,018 A | 9/1943 | Van Wert | |
| 2,571,700 A | 10/1951 | Ford | |
| 5,161,297 A | 11/1992 | Ruhl | |
| 2003/0022597 A1* | 1/2003 | Ghoshouni et al. | 451/28 |

FOREIGN PATENT DOCUMENTS

| | | | |
|---|---|---|---|
| WO | WO-9009682 | | 8/1990 |
| WO | WO02/11230 | * | 3/2000 |
| WO | WO-0011230 | | 3/2000 |

OTHER PUBLICATIONS

European Search Report for EP 08 10 4114 mailed on Nov. 5, 2008.

* cited by examiner

*Primary Examiner* — Michael Cleveland
*Assistant Examiner* — Robert Vetere
(74) *Attorney, Agent, or Firm* — Leydig, Voit & Mayer, Ltd.

(57) ABSTRACT

A method for forming an oxygen resistant aluminum oxide layer on an outer surface of a thermocouple sheath composed of a nickel alloy containing between 1% to 7% aluminum comprises removing a pre-formed oxide layer from the outer surface so as to create a prepared sheath; performing a controlled oxidation by subjecting the prepared sheath to atmospheric conditions at a temperature between 1000° C. and 1250° C. so as to form the oxygen resistant layer on the thermocouple sheath and to thus form an oxidized sheath; and cooling the oxidized sheath so as to prepare the oxidized sheath for service.

4 Claims, 3 Drawing Sheets

METHOD FOR OXIDISING A THERMOCOUPLE SHEATH

Priority is claimed to European Application No. EP 08104114.7 filed May 27, 2008, the entire disclosure of which is incorporated by reference herein.

The invention relates to thermocouples, contained in sheaths, that are suitable for measuring the hot gas temperature of gas turbines. In particularly the invention relates to methods for improving the service life of such thermocouples.

BACKGROUND

A thermocouple is typically embedded in an insulator, such as magnesium oxide, and encased along with the insulator in a metal sheath. For temperature measurement in the range of 600° C. to 1100° C. type K, or, more preferably for the higher temperature range, type E or N thermocouples are typically used as they are more cost effective than type B, R and S thermocouples which are made of more exotic materials capable of operating in still higher temperature regions.

While the sheath of the thermocouple may or may not be directly exposed to process gases, it nonetheless is desirable to provide the sheath with an oxygen resistant barrier so as to minimize oxygen diffusing into the cavity of the sheath. If oxygen is allowed to diffuse, oxidation of the thermocouples wires may occur. This may lead to measurement accuracy degradation as the electrical properties of the wires are changed and ultimately to breakage as oxidation reduces mechanical strength. These typical problems predominately define thermocouple service life in hot gas service.

A known method of ameliorating the degradation of thermocouple wires is through material selection of the sheath. While steel alloys are totally unsuitable across the hot gas temperature range, more expensive nickel alloys are only partially suitable at the upper end of the temperature range. More exotic alloys, such as those containing platinum or rhodium, while eminently suitable, are significantly more expensive than nickel alloys. Therefore despite the disadvantages of nickel alloys, nickel alloys typically containing higher than 74% nickel, greater than 15% chromium and between 4 to 5% aluminum, are commonly used in sheaths for hot gas service as the service life advantage of alternative metals does not warrant their higher costs.

As an alternative to manufacturing the entire sheath out of suitable material it is known to apply coatings to sheaths made of less expensive materials. For example U.S. Pat. No. 5,161,297 describes a method of gold coating a thermocouple sheath to enable operation above 540° C. Such a coating has however low abrasion resistance and the method of application significantly increases manufacturing complexity. U.S. Pat. No. 2,571,700 describes another coating method, with similar disadvantage, that involves coating the thermocouple wires directly with chromic oxide.

Another method of forming oxide coatings on the sheath includes the use of controlled oxidation in an oven with gas composition control. The control enables selective oxidisation and reduction of coating layers of the sheath, which can provide a desirable barrier layer. In such as method the oven environment may comprise, for example, pure oxygen, steam/hydrogen or $CO_2/CO$ atmospheres in varying ratios, varied during the oxidation process. Maintaining oven gas composition control is however complexity and expensive.

Thermocouple sheaths are quite small and fragile and so are not suitable for more aggressive manufacturing process that may damage the sheath. For example Patent WO 00/11230 that describes an oxide coating forming process for nickel alloy is unsuitable as it includes the unsuitable steps of hot roll and cold roll, which could damage sheaths. Further, as grain growth is promoted by heat treatment steps and the larger the grain size the less the resistance for diffusion should protective oxide layers be damaged, the multiple heat treatment steps of the described process may provide further disadvantages.

There exists therefore a need to provide a practical, alternative means of prolonging the life of thermocouples in hot gas turbine service.

SUMMARY OF THE INVENTION

An aspect of the invention is to provide a method for treating a sheath of a thermocouple that is made of nickel alloy, to overcome, or at least reduce, the problem of measurement drift and service life of thermocouple wires located in the sheath when the sheath, in gas turbine hot gas service, is exposed to temperatures of around 1000° C.

In an embodiment, the present invention provides a method that extends the life of such a thermocouple by forming a homogenous, essentially oxygen impermeable oxide layer on the sheath. Provided in an aspect is a method for forming an oxygen resistant aluminum oxide layer on the outer surface of a thermocouple sheath made from a nickel alloy containing aluminum in the range of 1% to 7%. The method includes the steps of:

a) first preparing the outer surface of the sheath by removing pre-formed oxide from the outside surfaces of the sheath. Failing to remove the oxide layer significantly reduces the homogeneity of the layer developed in later method steps, reducing the impermeability of the layer to gas and so this is an important step;

b) then subjecting the prepared sheath to controlled oxidation so as to form an oxygen resistant layer wherein the controlled oxidation is performed under atmospheric conditions at between 1000° C. and 1250° C. and is "controlled" by being performed in an oven thus ensuring homogeneity of the oxide layer without the complexity of other methods; and c) finally cooling the oxidized sheath of step b) to prepare it for service. In this way a useful alternative to coating methods is provided which improves the suitability of nickel alloys for hot gas service and provides a base on which further oxide growth, including porous oxide layers, can form during operating without detriment. The method was found to be particularly advantageous when applied to a sheath made from a nickel alloy having an aluminum content of between 4-5%. A further advantage is that the treatment process can be performed with only these three method steps, in the absence of further processing steps and so provides a simplified method as compared to other known methods while providing good diffusion resistance.

To add further control of the environment of step b) the oven may be constructed of inert material.

In a further embodiment, the temperature of step b) may be between 1100° C. and 1150° C. so by providing a method having low time dependency. In another aspect the controlled oxidation at these temperatures is performed for between 1-4 hours.

In a further embodiment the oxide layer of step a) is removed by grinding using grit paper finer or equal to 500 µm as it was found that its use further improves the homogeneity of the formed oxide layer of step b).

A further aspect is to overcome or at least ameliorate the disadvantages and shortcomings of the prior art or provide a useful alternative.

Other aspect and advantages will become apparent from the following description, taken in connection with the accompanying drawings wherein by way of illustration and example, an embodiment of the invention is disclosed.

Throughout this specification it is understood that gas turbine hot gas is defined as having a temperature in the range of 600° C. to 1100° C.

BRIEF DESCRIPTION OF THE DRAWINGS

By way of example, an embodiment of the invention is described more fully hereinafter with reference to the accompanying drawings, in which.

DETAILED DESCRIPTION

Figure 1:
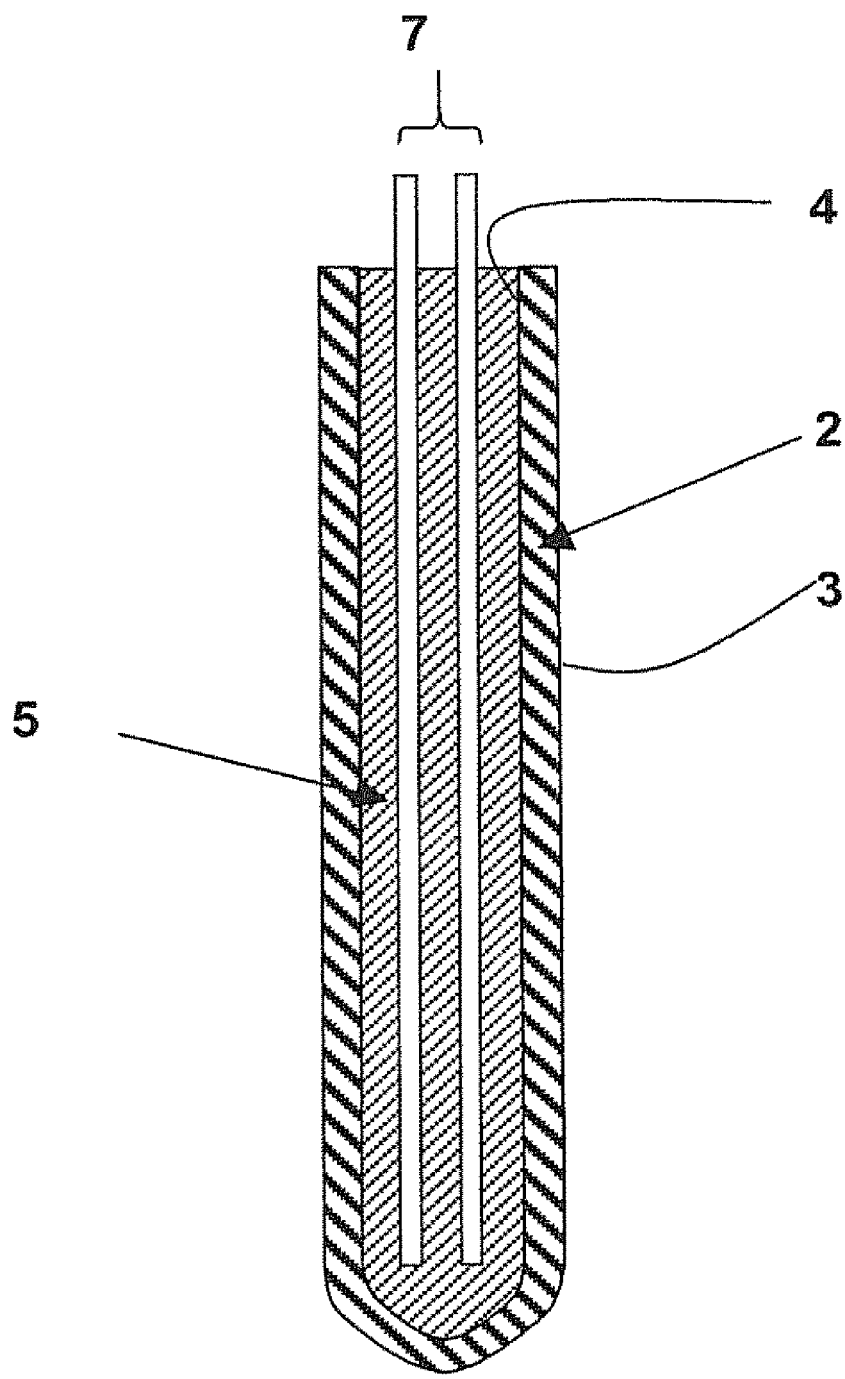
FIG. 1 is a thermocouple with a sheath to which exemplary methods are applied.

Preferred embodiments of the present invention are now described with reference to the drawings, wherein like reference numerals are used to refer to like elements throughout. In the following description, for purposes of explanation, numerous specific details are set forth in order to provide a thorough understanding of the invention. It may be evident, however, that the invention may be practiced without these specific details.

FIG. 1 shows a sheath 2 of a thermocouple. The sheath 2 has an outer surface 3 and an inner surface 4. The inner surface 3 forms a cavity in the sheath 2 for housing thermocouple wires 7 and insulation 5 in which the thermocouple wires 7 are embedded.

Figure 2:
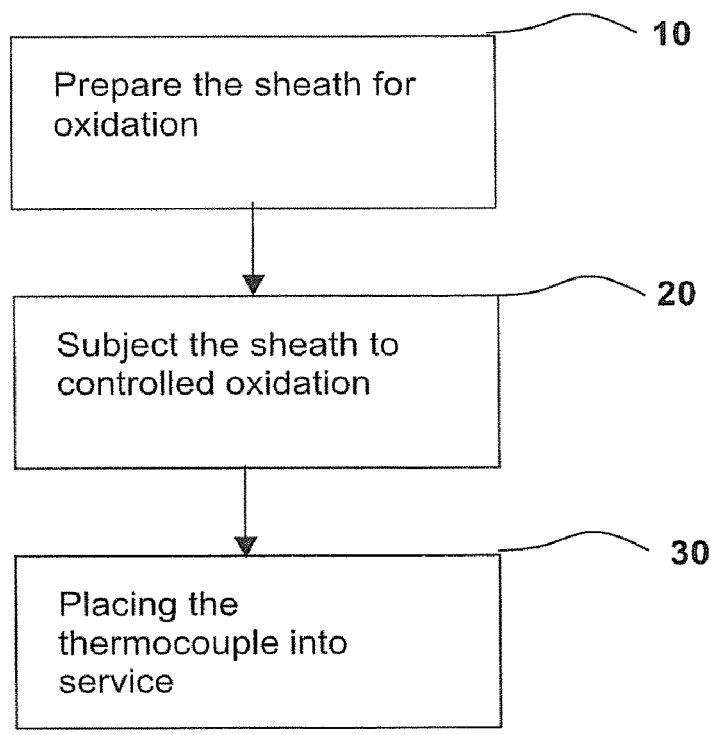
FIG. 2 is a flow diagram of an exemplary method.

FIG. 2 shows the basic steps of an exemplary method for forming a desirable aluminum oxide layer on the outer surface 3 of a thermocouple sheath 2 of the type shown in FIG. 1 that is made of nickel-based alloy containing aluminum. The first step is to prepare the sheath 2 for oxidation 10 by removing only pre-formed oxide from the outer surface 3 of the sheath 2. The prepared sheath 2 is then subjected to controlled oxidation 20 that results in the formation of a homogeneous oxide layer of aluminum on the outer surface 3 of the sheath 2 that is essentially oxygen and nitrogen impermeable. After this single heat treating step the sheath 2 is then ready to be placed into service 30 after cooling.

This method provides a means of hindering oxygen migration from the outside to the inside of the sheath 2, which can be the primary mechanism for thermocouple wire 7 degradation, without the added complexity of treating the inner surface 4 of the sheath 2.

The presence of aluminum in the alloy is important as it was found that a relatively pure homogeneous aluminum oxide layer is significantly less porous than oxides of other elements commonly found in nickel alloys, for example chromium or nickel itself. If the aluminum content is too low it is difficult to ensure an evenness of the formed oxide layer and therefore preferably the alloy contains at least 1% aluminum and most preferably at least 4% aluminum. While an exemplary method can be applied to nickel alloys with significantly higher aluminum content, the weakening effect on the alloy of aluminum restricts its practical use to 7%. Therefore an exemplary method is applied to a sheath 2 made of an alloy that contains less than 7% and most preferably less than 5% aluminum.

Figure 3:
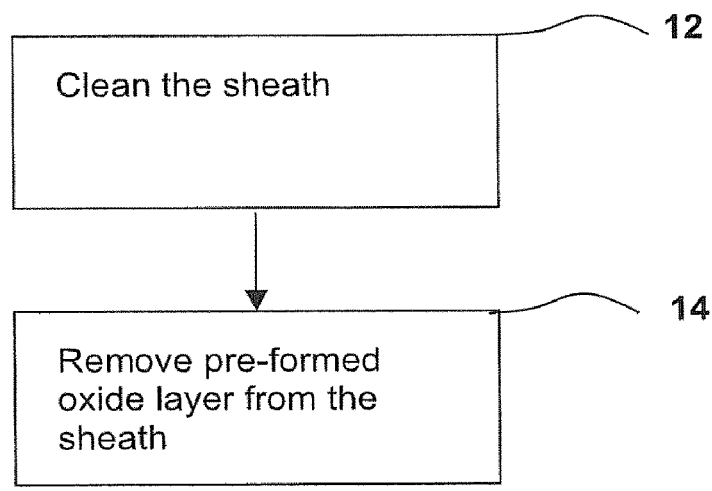
FIG. 3 is a flow diagram detailing the preparation step of FIG. 2.

In preparation for controlled oxidation, as shown in FIG. 3, the outer surface 3 of the sheath 2 is preferable cleaned 12 by a solvent, followed by the critical step of removing any pre-formed oxide from the outer surface 3 of the sheath 2. This can be achieved in a time efficient manner by the use of a series of grinding steps culminating in preferably the use of grit paper finer or equal to 500 μm. The method of removal however is not important as long as the end result of an essentially oxide free outer surface 3 is achieved. If oxide is not completed removed it was found that the impermeability of the oxide layer formed in the later oxidation step 20 will be compromised.

Figure 4:
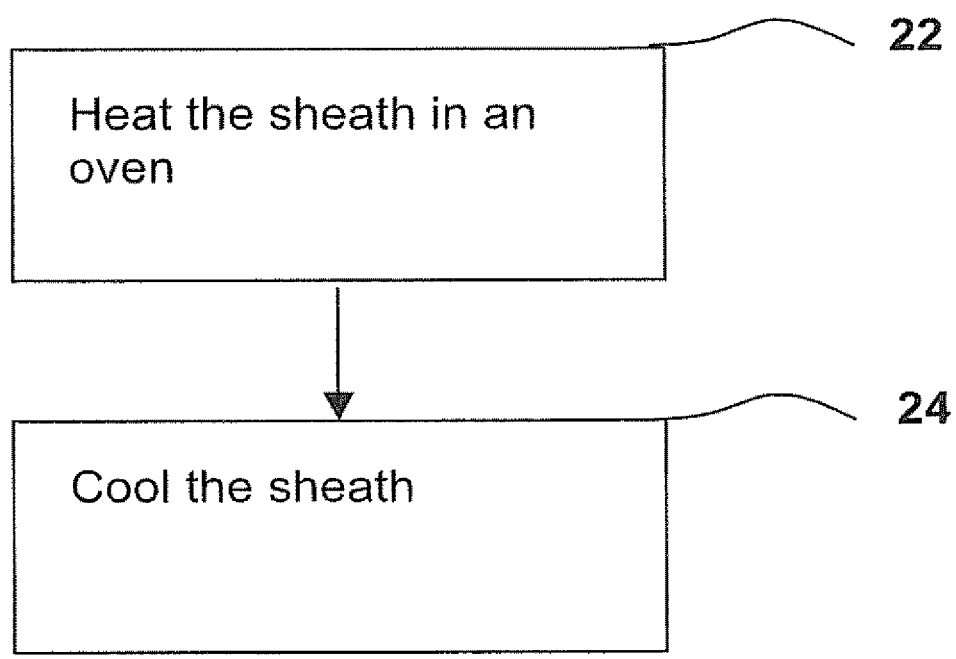
FIG. 4 is a flow diagram detailing the controlled oxidation step of FIG. 2.

In an exemplary method, after grinding, the sheath 2 is subjected to an oxidation step 20, as shown in FIG. 4 in order to form an aluminum oxide layer on the outer surface 3 of the sheath 2. The homogeneity of the layer and its chemical structure provides the property of impermeability. The oxidation is performed by controlled means by being performed in an oven 22, made preferably from inert material such as ceramic, under atmospheric conditions. The oxidation could alternatively, for example, be performed in service by controlling the gas turbine conditions however in such a case the environment is less controlled and so the predictability of the outcome is reduced.

The length of the controlled oxidation step 20 was found to be temperature dependent. Temperatures above 1000° C. can produce the required oxide layer although preferably the oven temperature is at least 1100° C. so as to ensure oxide formation during short oxidation cycles of, for example, one hour in length. It has further been found that between this temperature and a high temperature of 1150° C. increasing the oven time from one to four hours does not significantly alter the impervious quality of the formed layer. Above approximately 1250° C. however it was found that a suitable oxide layer could only be formed if the oven time was limited to one hour as extending the oxidation time causes the oxide layer to become inhomogeneous and become thick and porous so as to spallate. Therefore, in one exemplary embodiment, the oxidation step 20 is performed at between 1000° C. and 1250° C. for about one hour while in another exemplary embodiment the oxidation step 20 is performed at between 1100° C. and 1150° C. for one hour or greater.

Following the oxidation step 20, the sheath 2 is preferably cooled 24 and then brought into service 30. The oxide layer thus formed in exemplary embodiments is such that during operation the quality of the oxide layer may further improve. For example an indicator of the homogeneity, and thus potential service life, of the oxide layer is its hardness. Table 1 provides an example of the hardness value of an untreated sheath 2 and a treated sheath 2 after annealing, to simulate operating conditions, at 1000° C. for 1000 hours and 3000 hours. In this example the thermocouple is treated by an exemplary method that includes oxide removal from the sheath's outer surface 3 after which the sheath 2 is control oxidized at 1100° C. for one hour.

TABLE 1

| | Hardness Values (HV 0.1) | | |
|---|---|---|---|
| Sample | Initial value | 1000 hours annealing | 3000 hours annealing |
| Untreated | 323 +/− 11 | 292 +/− 12 | 208 +/− 8 |
| 1100° C./1 h | 315 +/− 4 | 331 +/− 8 | 331 +/− 12 |

Although the invention has been herein shown and described in what is conceived to be the most practical and preferred embodiment, it is recognized that departures can be made within the scope of the invention, which is not to be limited to details described herein but is to be accorded the full scope of the appended claims so as to embrace any and all equivalent devices and apparatus.

| REFERENCE NUMBERS | |
|---|---|
| 2 | Sheath |
| 3 | Outer surface |
| 4 | Inner surface |
| 5 | Insulator |
| 7 | Thermocouple wires |
| 10-30 | Process steps |

What is claimed is:

1. A method for forming an oxygen resistant aluminum oxide layer on an outer surface of a thermocouple sheath composed of a nickel alloy containing between 1% to 7% aluminum, the method consisting of:

removing a pre-formed oxide layer from the outer surface so as to create a prepared sheath;

performing a controlled oxidation by subjecting the prepared sheath to atmospheric conditions at a temperature between 1000° C. and 1250° C. so as to form the oxygen resistant layer on the thermocouple sheath and to thus form an oxidized sheath; and cooling the oxidized sheath so as to prepare the oxidized sheath for service.

2. The method as recited in claim 1, wherein the nickel alloy contains between 4% to 5% aluminum.

3. The method as recited in claim 1, wherein the temperature for the controlled oxidation is between 1100° C. and 1150° C.

4. The method as recited in claim 1, wherein the removing of the pre-formed oxide layer includes grinding.

* * * * *